US011482161B2

(12) United States Patent
Lee et al.

(10) Patent No.: US 11,482,161 B2
(45) Date of Patent: Oct. 25, 2022

(54) DISPLAY DEVICE

(71) Applicant: Samsung Display Co., LTD., Yongin-si (KR)

(72) Inventors: Seung Chan Lee, Hwaseong-si (KR); Yoo Min Ko, Suwon-si (KR); Joo Hee Jeon, Hwaseong-si (KR); Sung Jin Hong, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 128 days.

(21) Appl. No.: 17/110,109

(22) Filed: Dec. 2, 2020

(65) Prior Publication Data

US 2021/0248951 A1 Aug. 12, 2021

(30) Foreign Application Priority Data

Feb. 11, 2020 (KR) .................. 10-2020-0016581

(51) Int. Cl.
*G09G 3/32* (2016.01)
*G09G 5/10* (2006.01)
*H01L 33/58* (2010.01)
*H01L 25/075* (2006.01)

(52) U.S. Cl.
CPC .............. *G09G 3/32* (2013.01); *G09G 5/10* (2013.01); *H01L 25/0753* (2013.01); *H01L 33/58* (2013.01); G09G 2300/06 (2013.01)

(58) Field of Classification Search
CPC ........ G09G 3/32; G09G 5/10; G09G 2300/06; G09G 3/3208; G09G 2300/023; G09G 2320/0686; H01L 25/0753; H01L 33/58; H01L 27/3225; H01L 27/156; H01L 27/3244; H01L 51/52
See application file for complete search history.

(56) References Cited

U.S. PATENT DOCUMENTS

| 10,042,028 | B2 | 8/2018 | Jo et al. | |
|---|---|---|---|---|
| 2012/0086862 | A1* | 4/2012 | Gohshi | H04N 5/913 348/E5.119 |
| 2012/0170072 | A1* | 7/2012 | Miyazaki | G02B 13/26 359/619 |
| 2015/0116280 | A1* | 4/2015 | Moon | G06F 3/04166 345/178 |
| 2015/0212647 | A1* | 7/2015 | Kim | G06F 1/1616 345/173 |
| 2017/0351384 | A1* | 12/2017 | Yin | G06F 3/0418 |
| 2018/0366586 | A1 | 12/2018 | Son et al. | |
| 2021/0142028 | A1* | 5/2021 | Zhou | G02F 1/13338 |

FOREIGN PATENT DOCUMENTS

| JP | 2019-012090 | 1/2019 |
|---|---|---|
| KR | 10-1271335 | 6/2013 |
| KR | 10-1652046 | 8/2016 |
| KR | 10-1884639 | 8/2018 |

* cited by examiner

*Primary Examiner* — Antonio Xavier
(74) *Attorney, Agent, or Firm* — H.C. Park & Associates, PLC

(57) ABSTRACT

A display device including a display panel having a display area in which a plurality of pixels are arranged, and a light source unit overlapping the display panel and including at least one light source. The light source unit irradiates infrared light to a predetermined region within the display area when displaying an image on the display area to change the luminance of pixels disposed in the predetermined region.

18 Claims, 9 Drawing Sheets

DISPLAY DEVICE

CROSS-REFERENCE TO RELATED APPLICATION

This application claims priority from and the benefit of Korean Patent Application No. 10-2020-0016581 on Feb. 11, 2020, which is hereby incorporated by reference for all purposes as if fully set forth herein.

BACKGROUND

Field

Embodiments of the invention relate generally to a display device.

Discussion of the Background

A display device, such as a light emitting diode display or a liquid crystal display, is applied to various electronic devices, such as smart phones, mobile phones, and multimedia terminals. Since a screen provided by the display device is a part exposed from the electronic is device to the outside, the display device is a key element in a design of the electronic device. Efforts are being made to increase the ratio of the screen when the electronic device is viewed from the front (hereinafter referred to as a screen-to-body ratio). As the screen ratio increases, an area other than the screen, for example, an area capable of displaying information informing of an unexpected situation such as call reception, is gradually decreasing. Therefore, it may be necessary to display this information on the screen.

When an unexpected situation (for example, receiving a call or a message) occurs while the image is displayed on the screen for a web surfing, watching a video, etc. on the electronic device such as a smartphone, the electronic device may be designed so as to display the information on the screen and visually display the information to the user. For example, by dividing the screen, a notification may be displayed in a part while still displaying an image in another part or the image display may be stopped and a notification may be displayed on the screen (that is, the image is switched). In the case of the screen division, the quality of the image may deteriorate, and in the case of the image switching, the user must temporarily stop watching the video. In addition, since a process of signal processing according to an algorithm and of changing the image is required to display an unexpected situation on the screen, a delay may occur.

The above information disclosed in this Background section is only for understanding of the background of the inventive concepts, and, therefore, it may contain information that does not constitute prior art.

SUMMARY

Embodiments provide a display device capable of promptly and additionally displaying specific information on a displayed image without switching an image normally displayed on the screen.

Additional features of the invention will be set forth in the description which follows, and in part will be apparent from the description, or may be learned by practice of the invention.

An embodiment of the present invention provides a display device including a display panel including: a display area in which a plurality of pixels are arranged; and a light source unit overlapping the display panel and including at least one light source. Herein, the light source unit irradiates infrared light to a predetermined region within the display area when displaying an image on the display area to change the luminance of pixels disposed in the predetermined region.

Each pixel may include a transistor and a light emitting diode electrically connected to the transistor, and the infrared light may be irradiated to the transistor to generate a leakage current of the transistor.

When the image is displayed, the predetermined region may display a specific symbol.

A combination or one of the at least one light source may irradiate infrared light to the predetermined region.

The at least one light source may include a plurality of light sources arranged in a matrix form.

The at least one light source may include a plurality of light sources arranged in a predetermined shape, and the predetermined shape may correspond to the predetermined region.

The at least one light source may include a light source having a light emission surface of the predetermined shape, and the predetermined shape may correspond to the predetermined region.

The display device may further include an optical member between the display panel and the light source unit.

The optical member may include a light guide plate.

The predetermined region may have a smaller area than the display area.

Another embodiment of the present invention provides a display device including a display panel including: a display area in which a plurality of pixels are arranged; and a light source unit disposed on a rear surface of the display panel and including at least one infrared light source. A combination or one of the at least one infrared light source may irradiate infrared light to a predetermined region within the display area, and the image displayed on the display area may be displayed with a different luminance from a normal luminance in the predetermined region.

When the image is displayed, the predetermined region may display a specific symbol.

Each pixel may include a plurality of transistors and a light emitting diode electrically connected to the plurality of transistors, and the infrared light may be irradiated to at least one transistor among the plurality of transistors to generate a leakage current of the at least one transistor.

The at least one infrared light source may include a plurality of infrared light sources arranged in a matrix form.

The plurality of infrared light sources may be driven in a passive matrix method.

The at least one infrared light source may include a plurality of infrared light sources arranged in a predetermined shape, and the predetermined shape may correspond to the predetermined region.

The at least one infrared light source may include an infrared light source having a light emission surface of the predetermined shape, and the predetermined shape may correspond to the predetermined region.

The display device may further include an optical member between the display panel and the light source unit.

The optical member may include a light guide plate.

The infrared light source may be an infrared light emitting diode.

It is to be understood that both the foregoing general description and the following detailed description are illustrative and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the inventive concepts.

DETAILED DESCRIPTION

Figure 1:
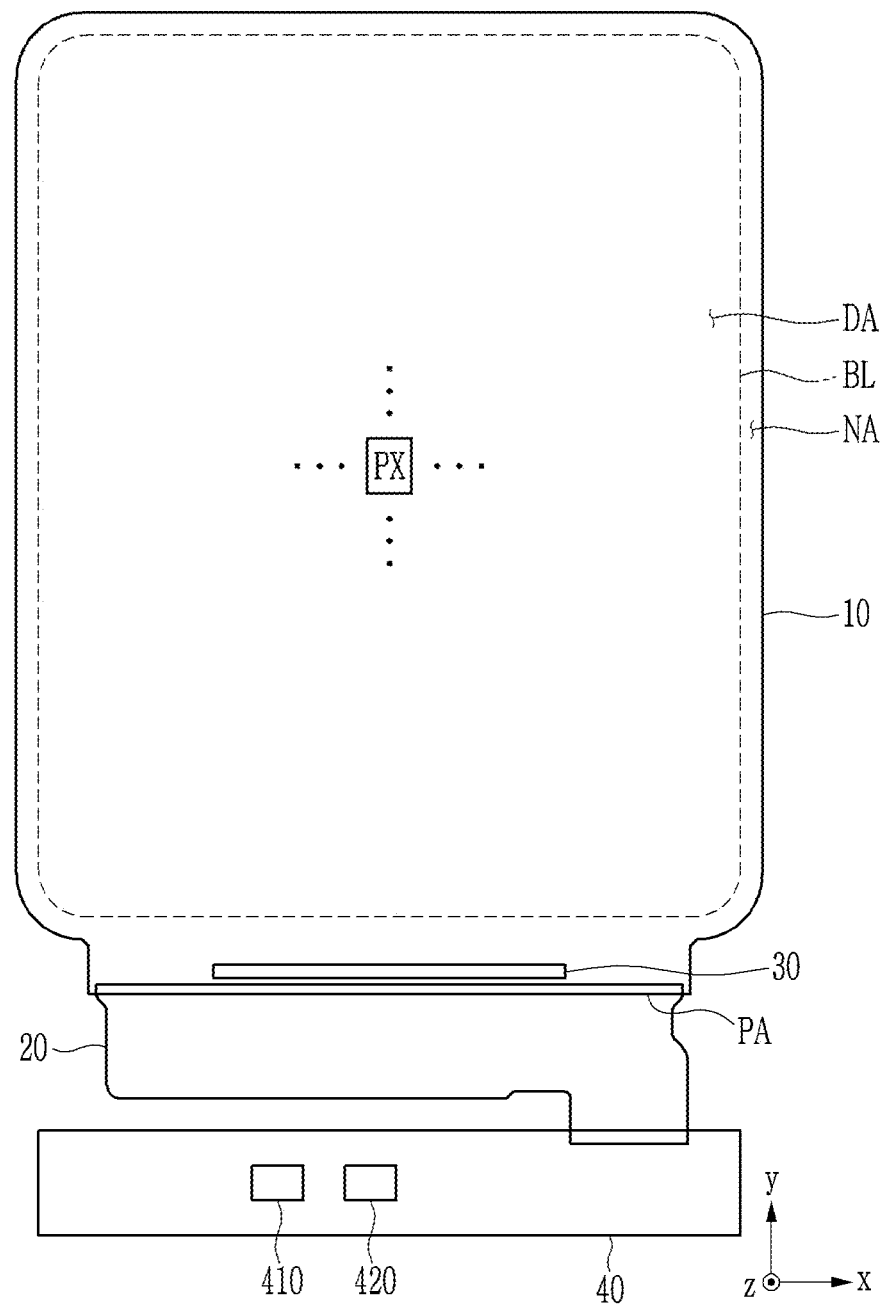
FIG. 1 is a view schematically showing a display device according to an embodiment.

In the following description, for the purposes of explanation, numerous specific details are set forth in order to provide a thorough understanding of various embodiments. As used herein "embodiments" are non-limiting examples of devices or methods employing one or more of the inventive concepts disclosed herein. It is apparent, however, that various embodiments may be practiced without these specific details or with one or more equivalent arrangements. In other instances, well-known structures and devices are shown in block diagram form in order to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

In the drawings, as symbols used for indicating directions, "x" is a first direction, "y" is a second direction perpendicular to the first direction, and "z" is a third direction perpendicular to the first direction and the second direction. The first direction (x), the second direction (y), and the third direction (z) may correspond to a horizontal direction, a vertical direction, and a thickness direction of the display device, respectively.

In the present specification, unless otherwise noted, "being overlapped" means being overlapped when viewed in a plan view, and being overlapped in the third direction (z).

A light emitting display is described as an example of a display device according to the embodiments with reference to the accompanying drawings.

FIG. 1 is a view schematically showing a display device according to an embodiment.

Referring to FIG. 1, the display device includes a display panel 10, a flexible printed circuit film 20 bonded to the display panel 10, and a driving device including an integrated circuit chip 30, and the like.

The display panel 10 includes a display area DA corresponding to a screen in which an image is displayed, and a non-display area NA in which circuits and/or signal lines for generating and/or transmitting various signal applied to the display area DA are disposed. The non-display area NA may surround the display area DA. In FIG. 1, the inside and the outside of a boundary line BL of a dotted line correspond to the display area DA and the non-display area NA, respectively.

Pixels PX may be disposed in a matrix form in the display area DA of the display panel 10. In the display area DA, various signal lines, such as a scan line, a data line, a driving voltage line, and the like, may be disposed. The scan line, the data line, the driving voltage line, and the like, are connected to each pixel PX, and each pixel PX may receive a scan signal, a data signal, and a driving voltage from these signal lines.

A touch sensor for sensing a user's contact and/or non-contact touch may be disposed in the display area DA. Although a generally rectangular display area DA is illustrated, the display area DA may have various shapes, such as polygons, circles, and ellipses other than rectangles.

A pad area PA, where pads for receiving signals from the outside of the display panel 10 are arranged, may be disposed in the non-display area NA of the display panel 10. The pad area PA may be disposed to extend along one edge of the display panel 10 in the first direction x. The flexible printed circuit film 20 may be bonded to the pad area PA, and the pads of the flexible printed circuit film 20 may be electrically connected to the pads of the pad area PA. The flexible printed circuit film 20 may be connected to a printed circuit board (PCB) 40 in which a processor 410, a memory 420, and the like, are disposed. The processor 410 may be an application processor AP including a central processing unit (CPU), a graphics processing unit (GPU), a modem, and the like. The display panel 10 may receive image data, signals related thereto, and power through the flexible printed circuit board 20.

A driving unit for generating and/or processing various signals for driving the display panel 10 may be disposed in the non-display area NA of the display panel 10. The driving unit includes a data driver for applying a data signal to the data lines, a gate driver applying a scan signal to the scan lines, and a signal controller for controlling the data driver and the gate driver. The pixels PX may receive a data signal at predetermined timing according to the scan signal generated by the gate driver. The gate driver may be integrated in the display panel 10 and may be disposed on at least one side of the display area DA. The data driver and the signal controller may be provided as an integrated circuit chip (also referred to as a "driving IC chip") 30, and the integrated circuit chip 30 may be mounted in the non-display area NA of the display panel 10. The integrated circuit chip 30 may be mounted on the flexible printed circuit film 20 or the like and electrically connected to the display panel 10.

Figure 2:
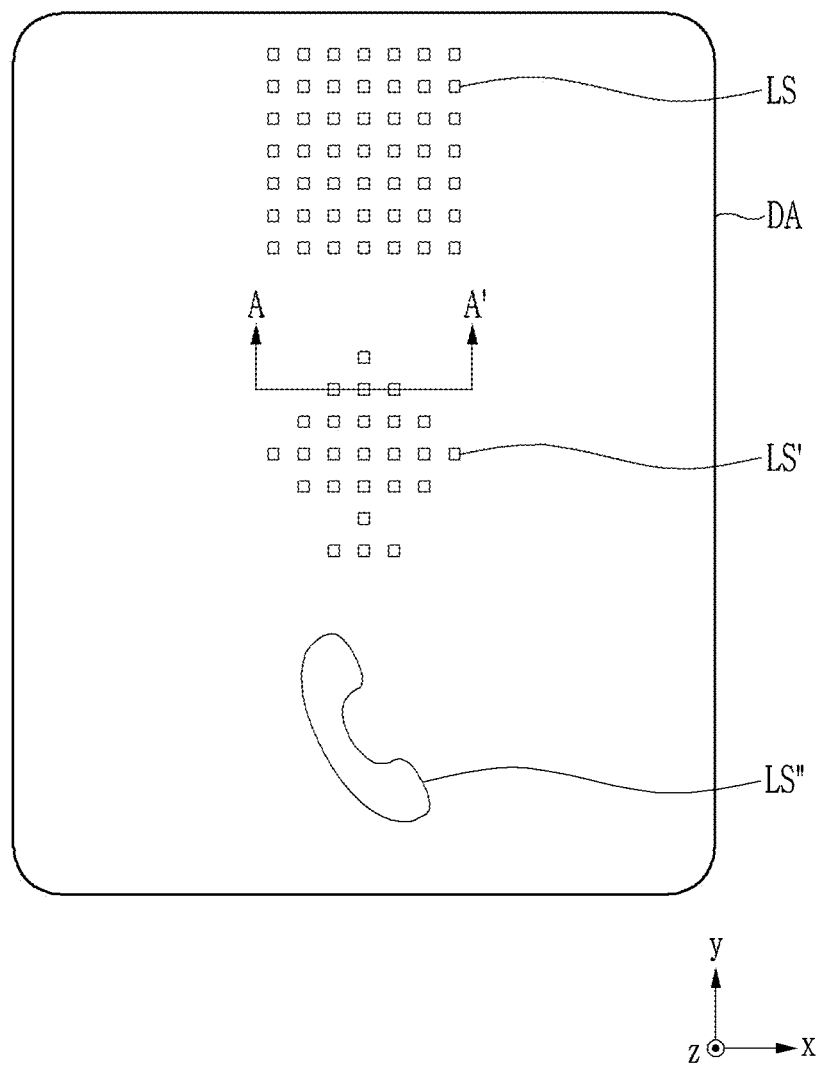
FIG. 2 is a view showing an arrangement of a light source capable of being disposed on a rear of a display panel in a display device according to an embodiment.
Figure 3:
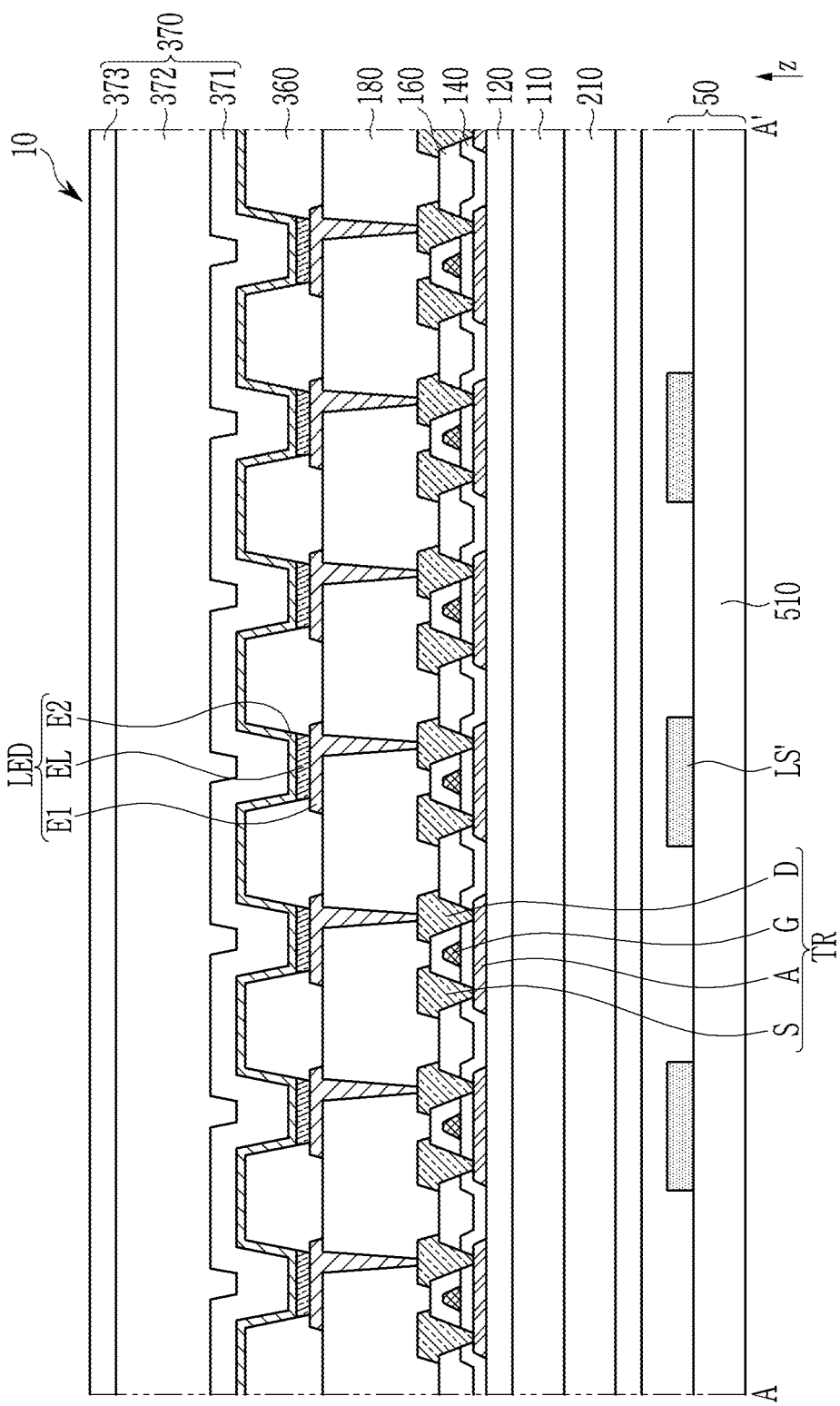
FIG. 3 is a schematic cross-sectional view taken along a line A-A' in FIG. 2.

FIG. 2 is a view showing an arrangement of a light source capable of being disposed on a rear of a display panel in a display device according to an embodiment, and FIG. 3 is a schematic cross-sectional view taken along a line A-A' in FIG. 2. FIG. 2 schematically shows only the display area DA of the display panel 10 for all of the configurations of the display device.

Referring to FIG. 2 and FIG. 3, the display device includes a light source unit 50 disposed on the rear surface of the display panel 10. The light source unit 50 may be disposed to overlap with at least a portion of the display area DA. The light source unit 50 may include light sources LS arranged in a matrix form in at least a portion of the display area DA, light sources LS' arranged in a predetermined shape, and/or light sources having a predetermined shape of a light emission surface LS". The light emission surface of each light source LS and LS' may have various shapes, such as a square and a circle.

The light sources LS, LS', and LS" may emit light that is not visually perceived by the user, such as infrared light, and may emit light in a wavelength range of about 780 nm to about 1500 nm or in a wavelength range of about 780 nm to about 1000 nm. The light sources LS, LS', and LS" may be infrared light emitting diodes, and the infrared light emitting diode(s) may be formed or disposed on a substrate 510. The light sources LS, LS', and LS" may emit light other than infrared light, such as visible light and/or ultraviolet light.

Light (e.g., infrared light) emitted from the light sources LS, LS', and LS" affects a transistor TR, which is an element constituting the pixel PX for displaying an image (e.g., a leakage current generation). Thus, the pixel PX may emit light that is darker or brighter than the normal luminance. Accordingly, an area in which pixels PX affected by light emitted from light sources LS, LS', and LS" in the display area DA are disposed and an area in which the pixels PX that are not affected are disposed may display the images with different luminances. For example, when an unexpected situation occurs, if at least some of the light sources LS are operated, the light sources LS' are operated, or the light sources LS" are operated to irradiate light to the specific pixels PX, it is possible to display a symbol informing of the unexpected situation while displaying the image. When the light sources LS are arranged in a matrix form, the light sources LS may be driven in a passive matrix method and may display various symbols. When the irradiation of light from the light sources LS, LS', and LS" ends, the symbol immediately disappears and only the image is normally displayed.

In this way, in displaying the symbol in the predetermined area of the display area DA, it is not necessary to change any signal (for example, the data voltage) provided to the display panel 10. In other words, while driving the display panel 10 normally to display the image for viewing by a user, the symbol may be displayed together with the image by simply lighting the light sources LS, LS', and LS". The light source unit 50 may receive lighting signals from the processor 410 of the electronic device, for example, to light the light sources LS, LS', and LS". Such an operation may be performed regardless of the image data provided to the display panel 10 or the driving of the display panel 10, and since the driving unit of the display panel 10 is not involved, the symbol may be immediately displayed without delay.

Figure 4:
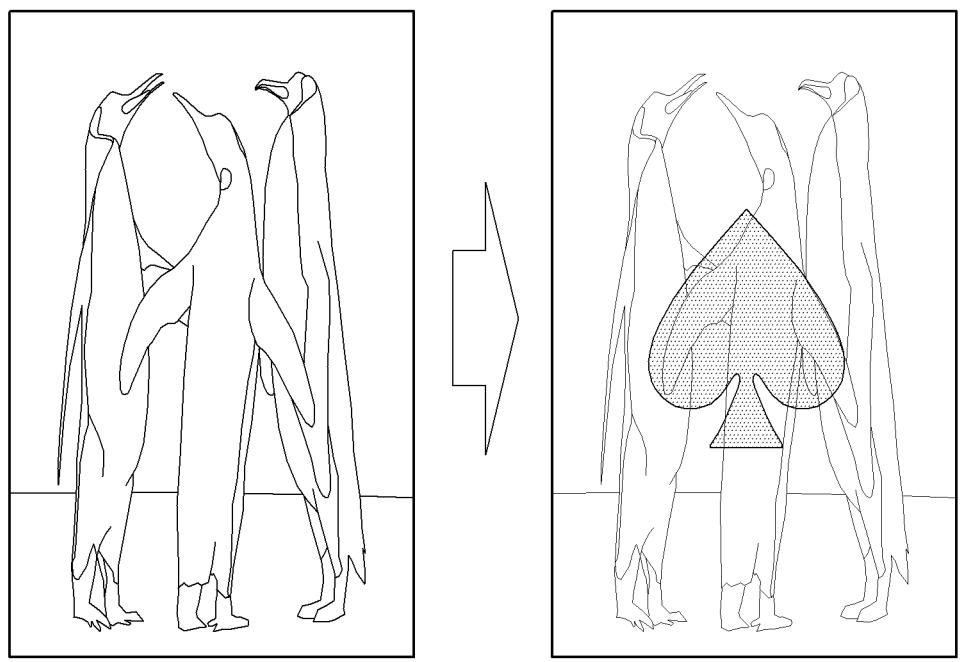
FIG. 4 is a diagram illustrating that a specific symbol is displayed while displaying an image.

FIG. 4 is a diagram illustrating that a specific symbol is displayed while displaying an image.

In FIG. 4, the drawing on the left illustrates that the image is normally displayed on the display area DA of the display device corresponding to the screen of the electronic device. The drawing on the right illustrates that a spade-shaped symbol is displayed on the display area DA while the image is normally displayed on the display area DA of the display device. The spade-shaped symbol, for example, may be displayed by lighting some of the light sources LS to correspond to the spade shape among the light sources LS arranged in a matrix form, lighting the light sources LS' arranged in the spade shape, or lighting a light source having the light emission surface of the spade shape. The image is displayed in the area where the symbol is displayed, but the image is displayed with different luminance from the normal luminance. For example, a high-gray pixel has a lower luminance and a low-gray pixel has increased luminance, so that it is displayed separately from an area where no symbol is displayed. Therefore, the user may recognize the symbol and may view the image that is originally displayed even in the region where the symbol is disposed. The pixels located in the region where the symbol is displayed may have either decreased luminance as a whole or increased luminance as a whole.

Again referring to FIG. 3, the structure of the display panel 10 is schematically described.

The display panel 10 includes a substrate 110 and layers, wires, and elements formed thereon.

The substrate 110 may be a flexible substrate including a polymer, such as polyimide or polyamide. The substrate 110 may include a barrier layer to prevent penetration of moisture or the like. The substrate 110 may be a rigid substrate made of glass.

A buffer layer 120 may be disposed on the substrate 110. The buffer layer 120 may block impurities that may be diffused from the substrate 110 to the semiconductor layer A in the process of forming the semiconductor layer A and reduce stress that the substrate 110 receives. The buffer layer 120 may include an inorganic insulating material, such as silicon oxide or silicon nitride.

The semiconductor layer A may be disposed on the buffer layer 120. The semiconductor layer A may include a channel region overlapping the gate electrode G, and source and drain regions on respective sides thereof. The semiconductor layer A may include polycrystalline silicon, amorphous silicon, or an oxide semiconductor.

A gate insulating layer 140 including an inorganic insulating material, such as silicon oxide or silicon nitride, may be disposed on the semiconductor layer A.

A gate conductor including a scan line and a gate electrode G may be disposed on the gate insulating layer 140. The gate conductor may include metals, such as molybdenum (Mo), copper (Cu), aluminum (Al), silver (Ag), chromium (Cr), tantalum (Ta), and titanium (Ti).

An interlayer insulating layer 160 may be disposed on the gate insulating layer 140 and the gate conductor. The interlayer insulating layer 160 may include an inorganic insulating material, such as silicon oxide or silicon nitride.

A data conductor including a data line, a source electrode S, and a drain electrode D may be disposed on the interlayer insulating layer 160. The source electrode S and the drain electrode D may be respectively connected to the source region and the drain region of the semiconductor layer A through openings formed in the interlayer insulating layer 160 and the gate insulating layer 140. The data conductors may include the metals such as aluminum (Al), copper (Cu), silver (Ag), gold (Au), platinum (Pt), palladium (Pd), nickel (Ni), molybdenum (Mo), tungsten (W), titanium (Ti), chromium (Cr), and tantalum (Ta). The source electrode S and the drain electrode D form the transistor TR together with the gate electrode G and the semiconductor layer A.

A passivation layer 180 may be disposed on the interlayer insulating layer 160 and the data conductor. The passivation layer 180 may include an organic insulating material, such as a polyimide, an acrylic polymer, and a siloxane polymer.

A first electrode E1 of a light emitting diode LED that may be an organic light emitting diode may be disposed on the passivation layer 180. The first electrode E1 may be connected to the drain electrode D through the opening of the passivation layer 180. The first electrode E1 may include metals, such as silver (Ag), nickel (Ni), gold (Au), platinum (Pt), aluminum (Al), copper (Cu), aluminum neodymium (AlNd), and aluminum nickel lanthanum (AlNiLa). The first electrode E1 may include a transparent conductive material, such as indium tin oxide (ITO) or indium zinc oxide (IZO).

A pixel defining layer 360 having an opening overlapping the first electrode E1 may be disposed on the passivation layer 180. The opening of the pixel defining layer 360 may define each pixel area. The pixel defining layer 360 may include an organic insulating material.

An emission layer EL may be disposed on the first electrode E1 and a second electrode E2 may be disposed on the emission layer EL. The second electrode E2 is made of a metal having a low work function, such as calcium (Ca), barium (Ba), magnesium (Mg), aluminum (Al), or silver (Ag), to form a thin layer so as to have light transmittance. The second electrode E2 may include a transparent conductive material, such as ITO or IZO.

The first electrode E1, the emission layer EL, and the second electrode E2 of each pixel PX form the light emitting diode LED such as the organic light emitting diode. One of the first electrode E1 and the second electrode E2 becomes a cathode, and the other becomes an anode.

An encapsulation layer 370 may be disposed on the second electrode E2. The encapsulation layer 370 seals the light emitting diode LED to prevent moisture or oxygen from penetrating from the outside. The encapsulation layer 370 may be a thin film including a first inorganic layer 371, an organic layer 372, and a second inorganic layer 373.

When the substrate 110 is the flexible substrate, a protection film 210 for protecting the display panel 10 may be attached below the substrate 110.

If light emitted from the light sources LS, LS', and LS" of the light source unit 50, which may be disposed on the rear surface of the display panel 10, reaches the channel region of the semiconductor layer A of the transistor TR, a leakage current is generated. Accordingly, since the voltage and/or the current applied to the first electrode E1 of the light emitting diode LED electrically connected to the transistor TR to which the light of the light sources LS, LS', and LS" is irradiated changes, the light emitting diode LED may emit the light having a different brightness from a predetermined brightness. As a result, the pixels PX including the light emitting diodes LED affected by the light of the light sources LS, LS', and LS" may display the image with the different luminance from the pixels including the light emitting diodes LED without being affected, and a portion of the image displayed with the different luminance may visually transmit, for example, the specific information displayed with the specific symbol to the user.

Figure 5:
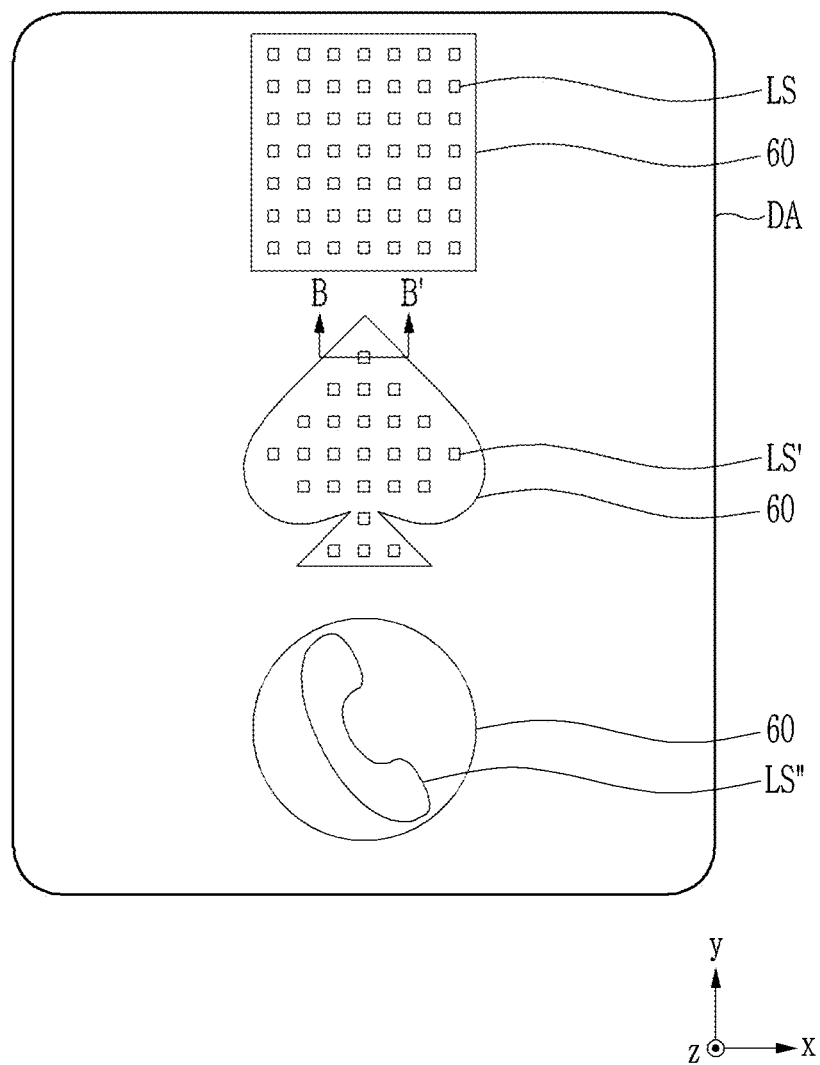
FIG. 5 is a view showing an arrangement of a light source in a display device according to an embodiment.
Figure 6:
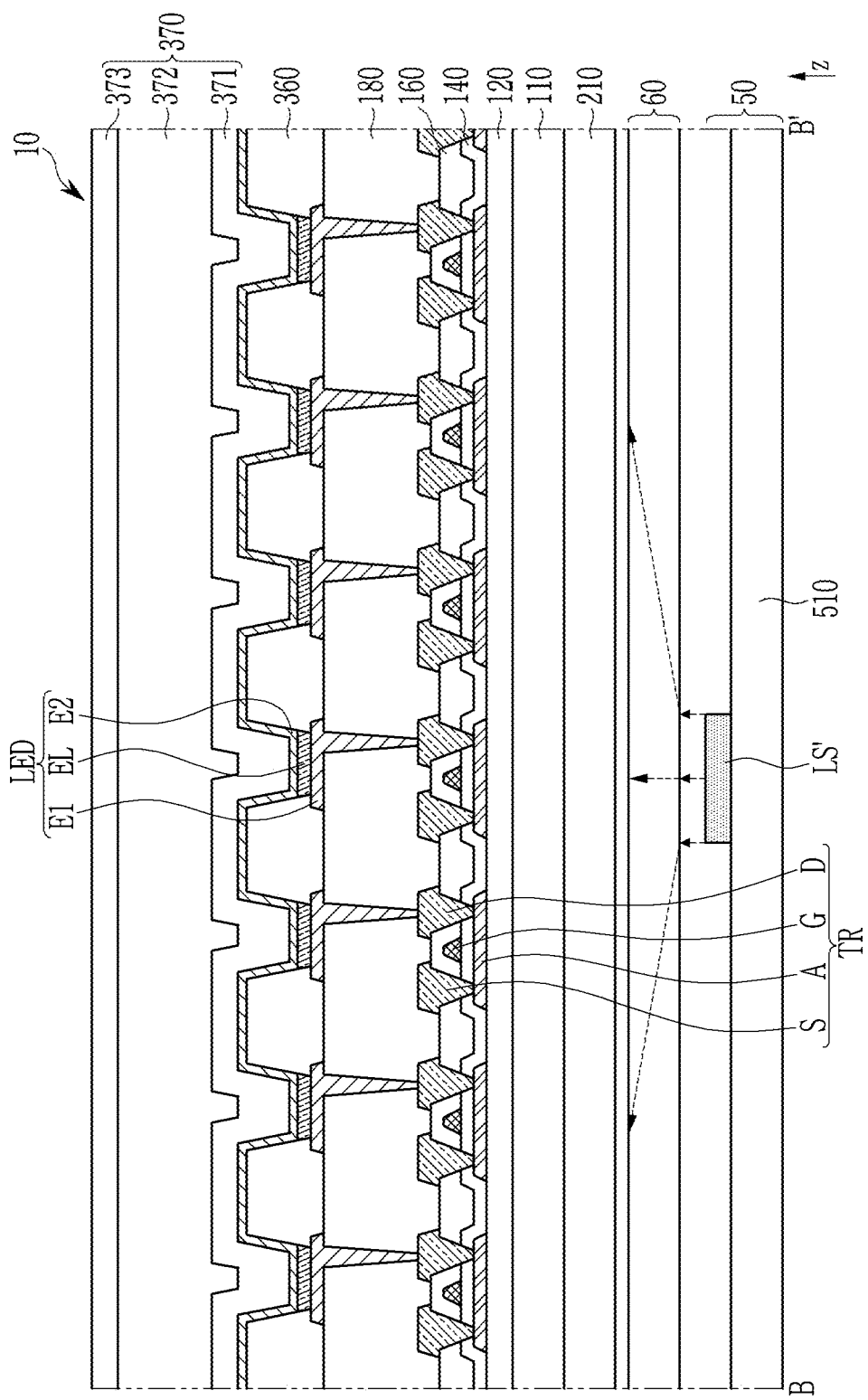
FIG. 6 is a schematic cross-sectional view taken along a line B-B' in FIG. 5.

FIG. 5 is a view showing an arrangement of a light source in a display device according to an embodiment, and FIG. 6 is a schematic cross-sectional view taken along a line B-B' in FIG. 5.

The embodiment of FIG. 5 and FIG. 6 differs from the embodiment of FIG. 3 and FIG. 4 in that the embodiment of FIG. 5 and FIG. 6 includes an optical member 60 disposed between the display panel 10 and the light source unit 50.

The optical member 60 may uniformly distribute the light emitted from the light sources LS, LS', and LS" of the light source unit 50 over a wider range. For example, in the case that there is no optical member 60, when one light source LS acts on the transistors TR of the n pixels PX, if the optical member 60 is interposed, one light source LS may act on the transistor TR of more pixels PX than n. Therefore, in displaying the specific symbol, the number, density, and/or area of the light sources LS, LS', and LS" may be reduced with the aid of the optical member 60.

The optical member 60 may overlap the light sources LS, LS', and LS" in the third direction z. The optical member 60 may be disposed in the part of the display area DA, or may be disposed throughout the entire display area DA. The optical member 60 may have a planar shape corresponding to the specific symbol.

The optical member 60 may include a light guide plate and may further include a diffuser sheet. The light guide plate may distribute the light emitted from the light sources LS, LS', and LS" in a wide range. The diffusion sheet may scatter the light emitted from the light guide plate to distribute it more uniformly. When including all of the optical member 60, the light guide plate, and the diffuser sheet, the light guide plate may be disposed adjacent to the light source unit 50, and the diffuser sheet may be disposed adjacent to the display panel 10.

The display device according to an embodiment is mainly described with reference to FIG. 7, FIG. 8, and FIG. 9 based on one pixel.

Figure 7:
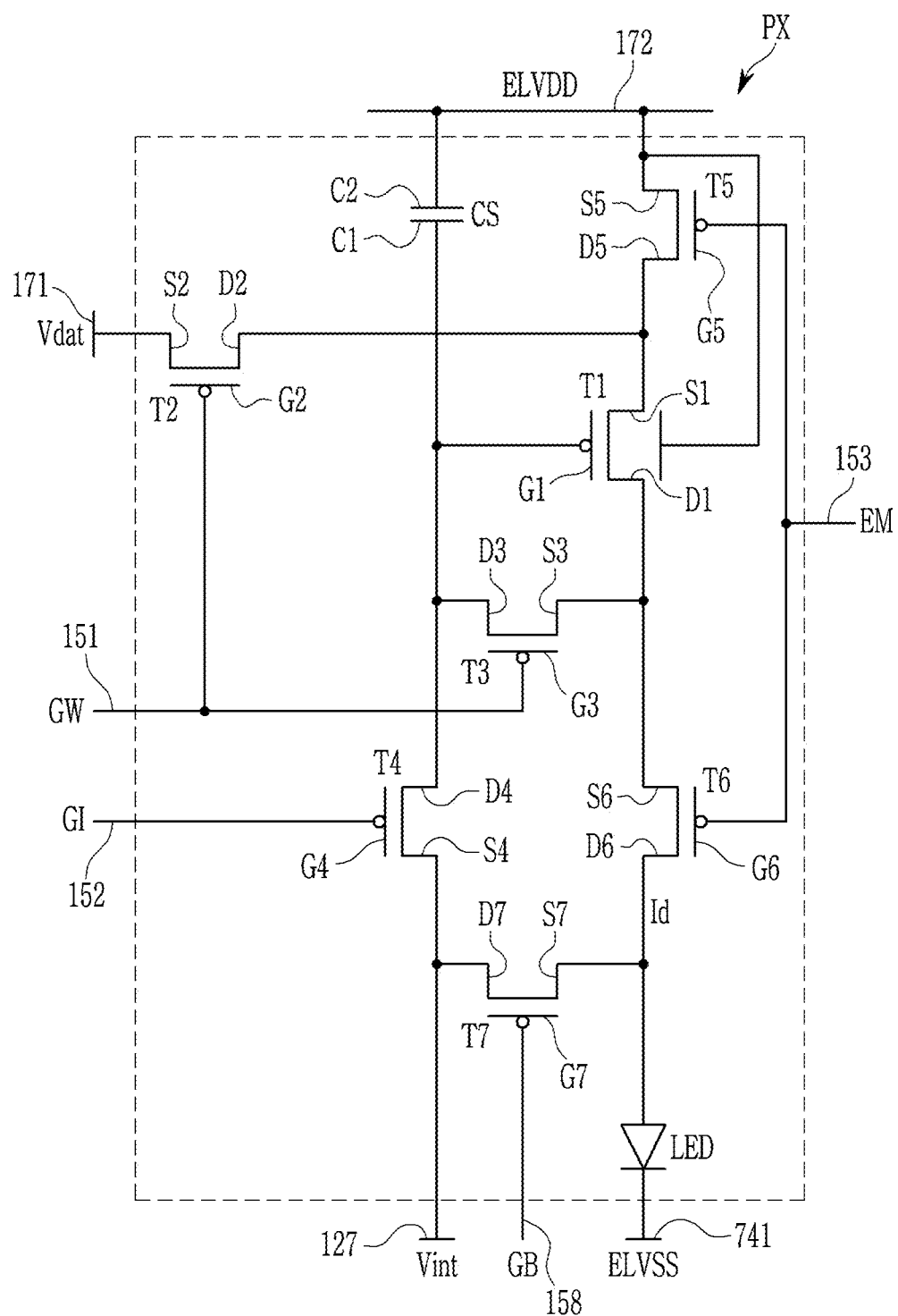
FIG. 7 is an equivalent circuit diagram of one pixel of a display device according to an embodiment.

FIG. 7 is an equivalent circuit diagram of one pixel of a display device according to an embodiment; FIG. 8 is a layout view of one pixel area of a display device according to an embodiment; and FIG. 9 is a cross-sectional view taken along a line C-C' in FIG. 8.

Referring to FIG. 7, the pixel PX may include transistors T1 to T7, a storage capacitor CS, and a light emitting diode LED connected to signal lines 127, 151, 152, 153, 158, 171, and 172.

The transistors T1 to T7 may include a driving transistor T1, a switching transistor T2, a compensation transistor T3, an initialization transistor T4, an operation control transistor T5, a light emission control transistor T6, and a bypass transistor T7.

The signal lines 127, 151, 152, 153, 158, 171, and 172 may include an initialization voltage line 127, a scan line 151, a previous scan line 152, a light emission control line 153, a bypass control line 158, a data line 171, and a driving voltage line 172.

The scan line 151 may transmit a scan signal GW to the switching transistor T2 and the compensation transistor T3. The previous scan line 152 may transmit a previous scan signal GI to the initialization transistor T4, the light emission control line 153 may transmit a light emission control signal EM to the operation control transistor T5 and the light emission control transistor T6, and the bypass control line 158 may transmit a bypass signal GB to the bypass transistor T7.

The data line 171 may receive a data voltage Vdat, and the driving voltage line 172 and the initialization voltage line 127 may receive a driving voltage ELVDD and an initialization voltage Vint, respectively. The initialization voltage Vint may initialize the driving transistor T1.

Each transistor T1 to T7 includes a gate electrode G1 to G7, a source electrode S1 to S7, and a drain electrode D1 to D7, respectively, and the storage capacitor CS includes a first electrode C1 and a second electrode C2. The electrodes of these transistors T1 to T7 and the storage capacitor CS may be connected as shown in FIG. 7. The anode of the light emitting diode LED that may be the organic light emitting diode is connected to the drain electrode D1 of the driving transistor T1 through the light emission control transistor T6, and the cathode of the light emitting diode LED is connected to a common voltage line 741 transmitting the common voltage ELVSS.

In the circuit structure of the pixel PX, the number of transistors, the number of capacitors, and the connection between them may be variously modified.

Figure 8:
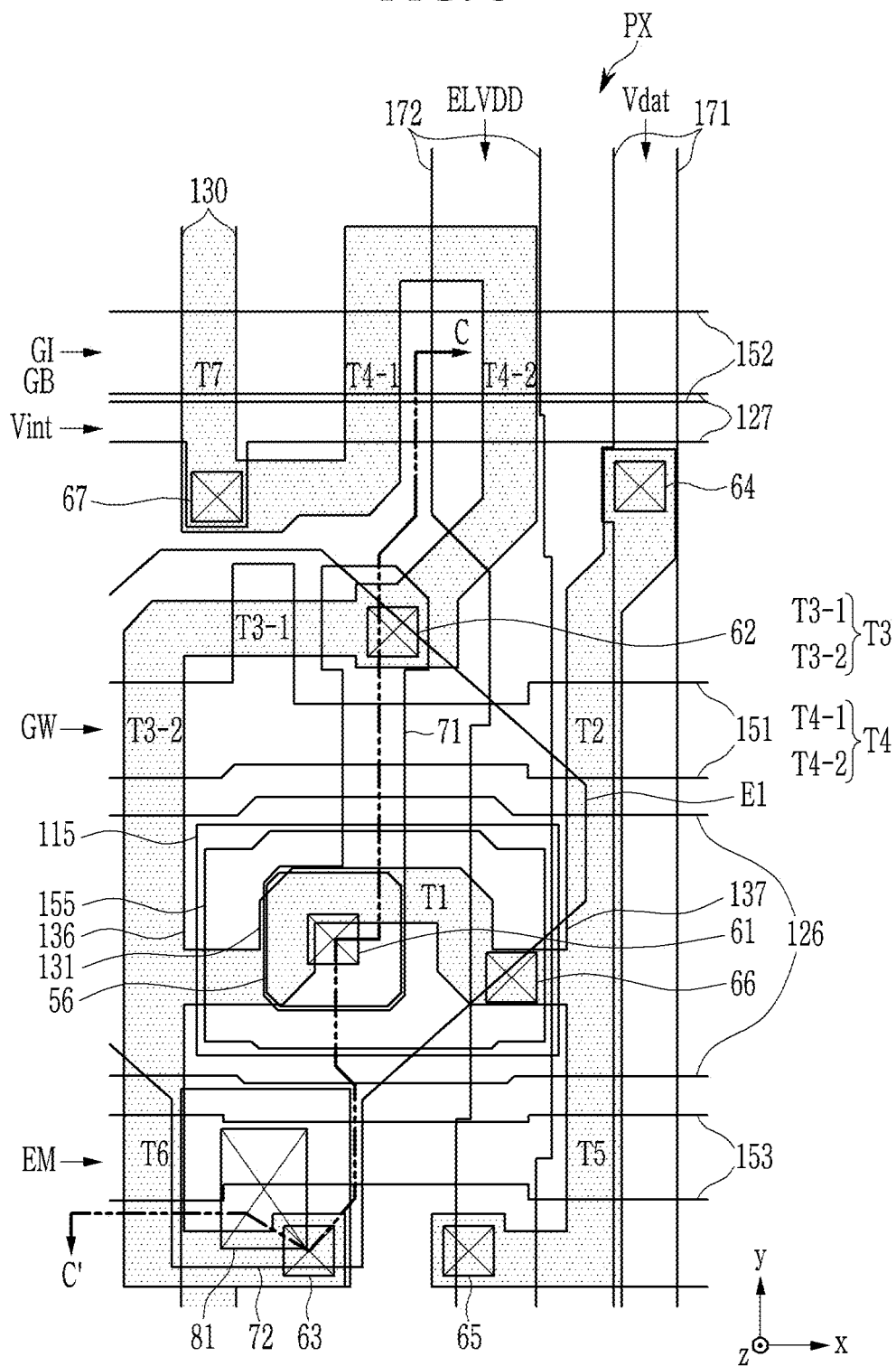
FIG. 8 is a layout view of one pixel area of a display device according to an embodiment.
Figure 9:
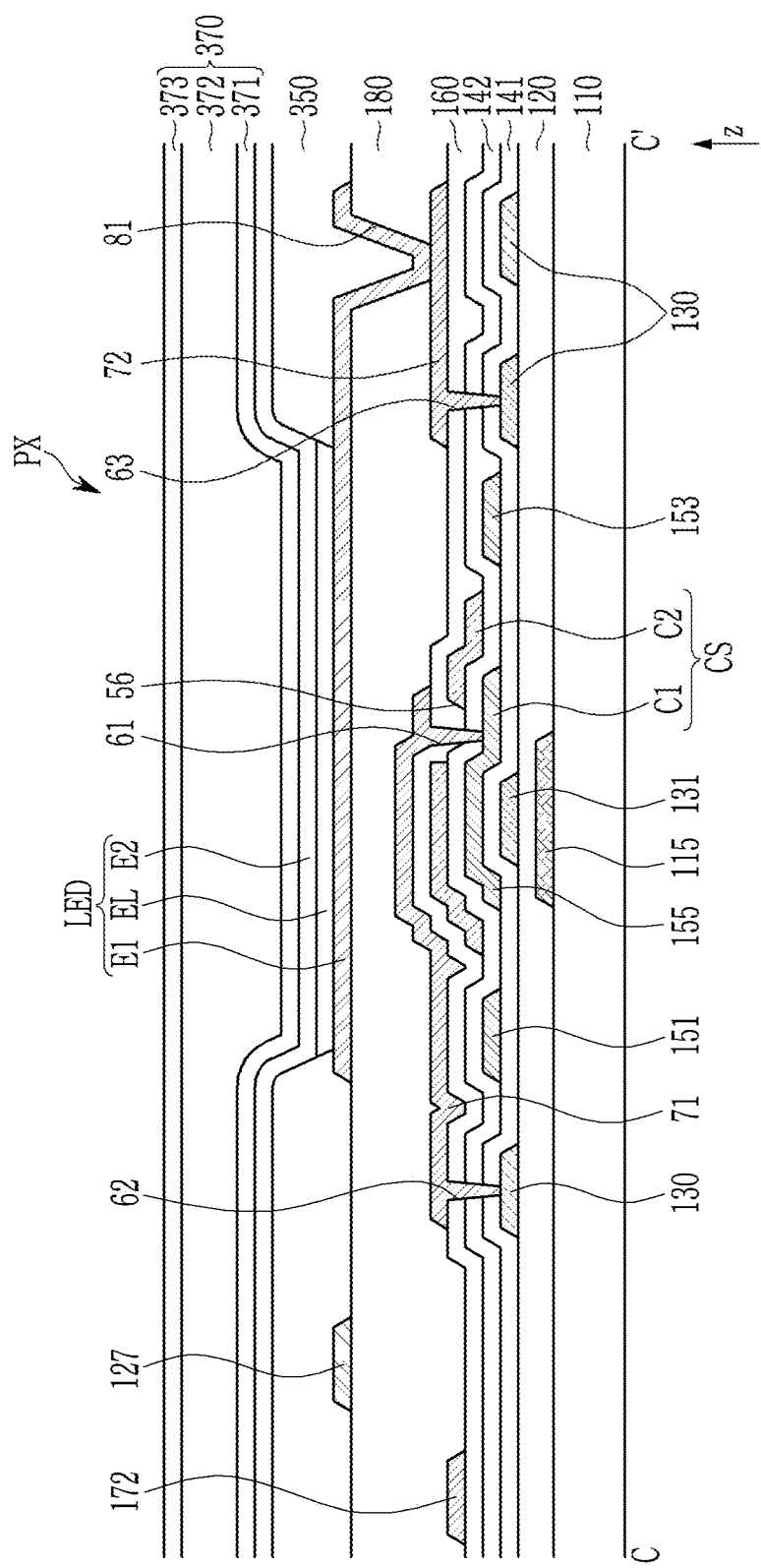
FIG. 9 is a cross-sectional view taken along a line C-C' in FIG. 8.

Referring to FIGS. 8 and 9, the display device may include the scan line 151, the previous scan line 152, the light emission control line 153, and the initialization voltage line 127 for transmitting the scan signal GW, the previous scan signal GI, the light emission control signal EM, and the initialization voltage Vint, respectively. The bypass signal GB may be transmitted through the previous scan line 152. The display device may include the data line 171 and the driving voltage line 172 transmitting the data voltage Vdat and the driving voltage ELVDD, respectively.

The display device may include the driving transistor T1, the switching transistor T2, the compensation transistor T3, the initialization transistor T4, the operation control transistor T5, the light emission control transistor T6, the bypass transistor T7, the storage capacitor CS, and the light emitting diode LED. The light emitting diode LED includes the first electrode E1, the emission layer EL, and the second electrode E2. The compensation transistor T3 and the initialization transistor T4 may have a dual gate structure to reduce a leakage current, that is, a structure in which a first compensation transistor T3-1 and a second compensation transistor T3-2 are connected and a structure in which a first initialization transistor T4-1 and a second initialization transistor T4-2 are connected.

Each channel, each source electrode, and each drain electrode of the driving transistor T1, the switching transistor T2, the compensation transistor T3, the initialization transistor T4, the operation control transistor T5, the light emission control transistor T6, and the bypass transistor T7 may be disposed in one extended semiconductor layer 130. The semiconductor layer 130 may be bent in various shapes. The semiconductor layer 130 may include a polycrystalline semiconductor such as polycrystalline silicon or an oxide semiconductor.

The semiconductor layer 130 may include the channel, and the source region and the drain region disposed on respective sides of the channel. The region between the source electrode and the drain electrode of different transistors in the semiconductor layer 130 may be doped to electrically connect the source electrode of one transistor and the drain electrode of the other transistor.

The channel of each transistor T1 to T7 may overlap the gate electrode of each transistor T1 to T7 and may be disposed between the source electrode and the drain electrode of each transistor T1 to T7. Each transistor T1-T7 may have a substantially identical stacked structure. Therefore, the driving transistor T1 is mainly described, and the remaining transistors T2-T7 are briefly described.

The driving transistor T1 includes the channel 131, the gate electrode 155, the source electrode 136, and the drain electrode 137. The channel 131 overlaps the gate electrode 155 between the source electrode 136 and the drain electrode 137. The source electrode 136 and the drain electrode 137 are adjacent to both sides of the channel 131, respectively. A connecting member 71 may be connected to the gate electrode 155 through an opening 61. For this connection, an opening 56 through which the connecting member 71 may penetrate may be formed in the second electrode C2 of the holding capacitor CS.

The gate electrode of the switching transistor T2 may be a part of the scan line 151. The data line 171 may be connected to the source electrode of the switching transistor T2 through an opening 64.

The compensation transistor T3 includes a first compensation transistor T3-1 and a second compensation transistor T3-2 adjacent to each other. The source electrode of the first compensation transistor T3-1 and the drain electrode of the second compensation transistor T3-2 are connected. The gate electrode of the first compensation transistor T3-1 may be a protrusion of the scan line 151. The connecting member 71 is connected to the drain electrode of the first compensation transistor T3-1 through an opening 62. The gate electrode of the second compensation transistor T3-2 may be a part of the scan line 151. The source electrode of the second compensation transistor T3-2 is connected to the source electrode of the light emission control transistor T6 and the drain electrode of the driving transistor T1.

The initialization transistor T4 includes a first initialization transistor T4-1 and a second initialization transistor T4-2. The gate electrode of the first initialization transistor T4-1 and the gate electrode of the second initialization transistor T4-2 may be a part of the previous scan line 152. The initialization voltage line 127 may be connected to the source electrode of the first initialization transistor T4-1 through an opening 67. The connecting member 71 may be connected to the drain electrode of the second initialization transistor T4-2 through the opening 62. The drain electrode of the first initialization transistor T4-1 is connected to the source electrode of the second initialization transistor T4-2.

The gate electrode of the operation control transistor T5 may be a part of the light emission control line 153. The driving voltage line 172 may be connected to the source electrode of the operation control transistor T5 through an opening 65.

The gate electrode of the light emission control transistor T6 may be a part of the light emission control line 153. A connecting member 72 is connected to the drain electrode of the light emission control transistor T6 through an opening 63.

The gate electrode of the bypass transistor T7 may be a part of the previous scan line 152. The source electrode of the bypass transistor T7 is connected to the drain electrode of the light emission control transistor T6. The drain electrode of the bypass transistor T7 is connected to the source electrode of the first initialization transistor T4-1.

The storage capacitor CS includes the first electrode C1 and the second electrode C2 overlapping via a second gate insulating layer 142 interposed therebetween. The first electrode C1 may correspond to the gate electrode 155 of the driving transistor T1, and the second electrode C2 may be an expanded part of a storage line 126.

One end of the connecting member 71 maybe connected to the first electrode C1 of the gate electrode 155 through the opening 61 and the opening 56. The other end of the connecting member 71 may be connected to the drain electrode of the first compensation transistor T3-1 and the drain electrode of the second initialization transistor T4-2 through the opening 62. Accordingly, the connecting member 71 may connect the gate electrode 155 of the driving transistor T1 to the drain electrode of the first compensation transistor T3-1 and the drain electrode of the second initialization transistor T4-2.

The driving voltage line 172 may be connected to the second electrode C2 through an opening 66. The storage capacitor CS may store charges corresponding to a difference between the driving voltage ELVDD transferred to the second electrode C2 through the driving voltage line 172 and the gate voltage of the gate electrode 155.

The first electrode E1 may be connected to the connection member 72 through an opening 81.

The operation of one pixel PX of the light emitting diode display having the above-described structure may include an initialization period, a programming period, and a light emission period.

During the initialization period, if the previous scan signal GI of a low level is supplied to the pixel PX through the previous scan line 152, the initialization transistor T4 is turned on and the initialization voltage Vint is applied from the initialization voltage line 127 to the gate electrode G1 of the driving transistor T1 through the initialization transistor T4 so that the driving transistor T1 is initialized through the initialization voltage Vint.

During the programming period, if the scan signal GW of a low level is supplied to the pixel PX through the scan line 151, the switching transistor T2 and the compensation transistor T3 are turned on, and the driving transistor T1 is diode-connected by the turned-on compensation transistor T3 and biased in the forward direction. Then, the compensation voltage (Vdat+Vth, where Vth is a negative value)) reduced by the threshold voltage Vth of the driving transistor T1 from the data voltage Vdat transmitted through the data line 171 is applied to the gate electrode G1 of the driving transistor T1. The compensation voltage (Vdat+Vth) and the driving voltage ELVDD are applied to the first electrode C1 and the second electrode C2 of the storage capacitor CS, and a charge corresponding to a voltage difference of the first electrode C1 and the second electrode C2 is stored at the storage capacitor CS.

During the light emission period, the light emission control signal EM supplied from the light emission control line 153 is changed into a low level, so that the operation control transistor T5 and the light emission control transistor T6 are turned on. Then, a driving current Id corresponding to the voltage difference between the gate voltage of the gate electrode G1 of the driving transistor T1 and the driving voltage ELVDD is generated, and the driving current Id is supplied to the light emitting diode LED through the light emission control transistor T6. During the light emission period, the gate-source voltage Vgs of the driving transistor T1 is maintained as "(Vdat+Vth)−ELVDD" by the storage capacitor CS. According to the current-voltage relationship of the driving transistor T1, the driving current Id is proportional to "(Vdat−ELVDD)$^2$", which is the square of the value obtained by subtracting the threshold voltage Vth from the gate-source voltage Vgs. Therefore, since the driving current Id is determined regardless of the threshold voltage Vth of the driving transistor T1, it is possible to improve the non-uniformity of the characteristics of the driving transistor T1 that may occur due to process dispersion, for example.

The bypass transistor T7 disperses a part of a minimum current (i.e., because the gate-source voltage Vgs of the driving transistor T1 is less than the threshold voltage Vth, a current in a condition that the driving transistor T1 is turned off) of the driving transistor T1 as a bypass current Ibp to a current path other than the current path on the organic light emitting diode side. Accordingly, a black gray may be further correctly displayed and the contrast ratio may be improved.

When the light emitted from the light sources LS, LS', and LS" of the light source unit 50 is irradiated to the pixel PX operating as described above, the leakage occurs in at least some of the transistors T1 to T7 such that the pixel PX may display a different luminance from a predetermined luminance. For example, when the leakage occurs in the operation control transistor T5, the driving voltage ELVDD and the data voltage Vdat voltage are mixed such that the luminance of a high grayscale (e.g., white) may be decreased and the luminance of low a grayscale (e.g., black) may be increased. When the leakage occurs in the light emission control transistor T6 and the bypass transistor T7, for example, a part of the data voltage Vdat may escape through the light emission control transistor T6 and the bypass transistor T7 during the programming period. Accordingly, a delay occurs in writing the data voltage Vdat, and the luminance of the pixel PX may be changed. Therefore, by controlling or setting the region to which the light emitted from the light sources LS, LS', and LS" is irradiated, the luminance of the specific region of the screen may change while displaying the image normally. Accordingly, the specific region in which the luminance has changed may be displayed as a symbol and recognized by the user.

According to the design of the pixel circuit, for the pixels PX located in the region to which the light from the light sources LS, LS', and LS" of the light source unit 50 is irradiated, due to the leakage that occurs in at least one transistor constituting the pixel circuit, some pixels PX may increase the luminance and some pixels PX may decrease the luminance, and the luminance of all pixels PX may increase or decrease as a whole. In any case, while the image is normally displayed on the display area DA, the region to which the light is irradiated may be recognized to be distinguished from other areas.

The cross-sectional structure of the display device according to an embodiment is now described according to a stacking order with reference to FIG. 9.

The buffer layer 120 may be disposed on the substrate 110, and the semiconductor layer 130 including the channel, the source electrode, and the drain electrode of the transistors T1 to T7 may be disposed on the buffer layer 120.

A light blocking layer 115 may be disposed between the substrate 110 and the semiconductor layer 130, for example between the substrate 110 and the buffer layer 120. The light blocking layer 115 may be disposed to overlap the channel of at least driving transistor T1, thereby preventing external light from inflowing to the channel of the driving transistor T1.

The light blocking layer 115 may not overlap the channels of operation control transistor T5, the light emission control transistor, T6 and/or the bypass transistor T7, for example. Accordingly, the light from the light sources LS, LS', and LS" of the light source unit 50 inflows to the channels of the operation control transistor T5, the light emission control transistor T6, and/or the bypass transistor T7, thereby generating the leakage. Therefore, the luminance of the pixels PX to which the light emitted from the light sources LS, LS', and LS" is irradiated may be changed.

A first gate insulating layer 141 may be disposed on the semiconductor layer 130, and a first gate conductor including the gate electrodes of the transistors T1 to T7, the scan line 151, the previous scan line 152, the light emission control line 153, and the first electrode C1 may be disposed on the first gate insulating layer 141.

A second gate insulating layer 142 may be disposed on the first gate conductor, and a second gate conductor including the storage line 126 and the second electrode C2 may be disposed on the second gate insulating layer 142.

An interlayer insulating layer 160 may be disposed on the second gate conductor. The data conductor including the data line 171, the driving voltage line 172, and the connecting members 71 and 72 may be disposed on the interlayer insulating layer 160.

One end of the connecting member 71 may be connected to the first electrode C1 through the opening 61 of the insulating layers 142 and 160, and the other end of the connecting member 71 may be connected to the drain electrode of the second compensation transistor T3-2 and the drain electrode of the second initialization transistor T4-2 through the opening 62 of the insulating layers 141, 142, and 160. The connecting member 72 may be connected to the drain electrode of the light emission control transistor T6 through the opening 63 of the insulating layers 141, 142, and 160. The data line 171 may be connected to the drain electrode of the light emission control transistor T6 through the opening 64 of the insulating layers 141, 142, and 160. The driving voltage line 172 may be connected to the source electrode of the operation control transistor T5 and the second electrode C2 through the openings 65 and 66 of the insulating layers 141, 142, and 160.

A passivation layer 180 may be disposed on the data conductor, and the first electrode E1 and the initialization voltage line 127 may be disposed on the passivation layer 180. The first electrode E1 referred to as the pixel electrode may be connected to the connecting member 72 through the opening 81 of the passivation layer 180. The initialization voltage line 127 may be connected to the source electrode of the first initialization transistor T4-1 through the opening 67 of the insulating layers 141, 142, 160, and 180.

The pixel defining layer 360 having the opening overlapping the first electrode E1 may be disposed on the passivation layer 180.

The emission layer EL may be disposed on the first electrode E1 and the second electrode E2 referred to as a common electrode may be disposed on the emission layer EL. The first electrode E1, the emission layer EL and the second electrode E2 form the light emitting diode LED. The first electrode E1 and the second electrode E2 may be the anode and the cathode, respectively, or vice versa. Holes and electrons are injected into the light emitting layer EL from the first electrode E1 and the second electrode E2, respectively, and light is emitted when the excitons of the injected holes and electrons fall from an excited state to the ground state.

The encapsulation layer 370 protecting the light emitting diode LED may be disposed on the second electrode E2. The encapsulation layer may be in contact with the second electrode E2 and may be spaced apart from the second electrode E2. The encapsulation layer may include at least one inorganic layer and at least one organic layer.

The position and arrangement of the above elements may be variously changed according to the design.

According to the inventive concepts, it is possible to provide a display device capable of promptly and additionally displaying specific information on the displayed image without switching the image normally displayed on the display area (screen). In addition, even if not specifically mentioned, according to the inventive concepts, other effects may be recognized throughout the specification.

Although certain embodiments have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:
   a display panel including a display area in which a plurality of pixels are arranged; and
   a light source unit overlapping the display panel and including at least one light source,
   wherein the light source unit is configured to irradiate infrared light to a predetermined region within the display area when displaying an image on the display area to change the luminance of pixels disposed in the predetermined region;
   wherein:
   each pixel includes a transistor and a light emitting diode electrically connected to the transistor; and
   irradiation of the infrared light to the transistor generates a leakage current of the transistor.

2. The display device of claim 1, wherein, during display of the image, the predetermined region displays a specific symbol.

3. The display device of claim 1, wherein a combination or one of the at least one light source is configured to irradiate infrared light to the predetermined region.

4. The display device of claim 1, wherein the at least one light source includes a plurality of light sources arranged in a matrix form.

5. The display device of claim 1, wherein the at least one light source includes a plurality of light sources arranged in a predetermined shape, and the predetermined shape corresponds to the predetermined region.

6. The display device of claim 1, wherein the at least one light source includes a light source having a light emission surface of a predetermined shape, and the predetermined shape corresponds to the predetermined region.

7. The display device of claim 1, further comprising an optical member between the display panel and the light source unit.

8. The display device of claim 7, wherein the optical member includes a light guide plate.

9. The display device of claim 1, wherein the predetermined region has a smaller area than the display area.

10. A display device comprising:
    a display panel including a display area in which a plurality of pixels are arranged; and
    a light source unit disposed on a rear surface of the display panel and including at least one infrared light source,
    wherein:
    a combination or one of the at least one infrared light source is configured to irradiate infrared light to a predetermined region within the display area; and
    the image displayed on the display area is displayed with a different luminance from a normal luminance in the predetermined region;
    wherein:
    each pixel includes a plurality of transistors and a light emitting diode electrically connected to the plurality of transistors; and
    irradiation of the infrared light to at least one transistor among the plurality of transistors generates a leakage current of the at least one transistor.

11. The display device of claim 10, wherein, during display of the image, the predetermined region displays a specific symbol.

12. The display device of claim 10, wherein the at least one infrared light source includes a plurality of infrared light sources arranged in a matrix form.

13. The display device of claim 12, wherein the plurality of infrared light sources are configured to be driven in a passive matrix method.

14. The display device of claim 10, wherein the at least one infrared light source includes a plurality of infrared light sources arranged in a predetermined shape, and the predetermined shape corresponds to the predetermined region.

15. The display device of claim 10, wherein the at least one infrared light source includes an infrared light source having a light emission surface of the predetermined shape, and the predetermined shape corresponds to the predetermined region.

16. The display device of claim 10, further comprising an optical member between the display panel and the light source unit.

17. The display device of claim 16, wherein the optical member includes a light guide plate.

18. The display device of claim 10, wherein the infrared light source is an infrared light emitting diode.

* * * * *